(12) United States Patent
Lee

(10) Patent No.: US 6,815,283 B2
(45) Date of Patent: Nov. 9, 2004

(54) METHOD OF MANUFACTURING SEMICONDUCTOR DEVICES

(75) Inventor: Hee Youl Lee, Ichon-Shi (KR)

(73) Assignee: Hynix Semiconductor Inc, Ichon-shi (KR)

( * ) Notice: Subject to any disclaimer, the term of this patent is extended or adjusted under 35 U.S.C. 154(b) by 157 days.

(21) Appl. No.: 10/005,843

(22) Filed: Dec. 7, 2001

(65) Prior Publication Data

US 2003/0003661 A1 Jan. 2, 2003

(30) Foreign Application Priority Data

Jun. 29, 2001 (KR) ........................................ 2001-38421

(51) Int. Cl.[7] ......................................... H01L 21/8238
(52) U.S. Cl. ..................... 438/211; 438/689; 438/734
(58) Field of Search ................................ 438/230, 231, 438/265, 303, 305–7, 593, 595, 211, 258, 275, 689, 734; 257/316, 321, 324, 326, 408

(56) References Cited

U.S. PATENT DOCUMENTS 6,323,519 B1 * 11/2001 Gardner et al. ............. 257/336
6,455,362 B1 *  9/2002 Tran et al. .................. 438/194
6,482,699 B1 * 11/2002 Hu et al. ..................... 438/258

FOREIGN PATENT DOCUMENTS

JP          8-241932          9/1996

* cited by examiner

Primary Examiner—W. David Coleman
(74) Attorney, Agent, or Firm—Jacobson Holman PLLC

(57) ABSTRACT

The present invention relates to a method of manufacturing a semiconductor device. The present invention sequentially forms a DCS HTO film and a nitride film on the entire structure after a self align source etch process so that so that they can serve as a spacer for compensating for the sidewall of a gate structure damaged upon the self align source etch process. Therefore, the present invention can increase the integrity capability of data by preventing movement of charges and holes between a floating gate electrode and peripheral circuits and can mitigate a stress due to the nitride film in a subsequent process. Further, the present invention can prevent increase of the thickness of the dielectric film between a first polysilicon silicon layer and a second polysilicon layer in a subsequent annealing process and can secure the uniformity of a screen oxide film to make uniform the depth of the junction upon a high concentration ion implantation process. In addition, the present invention can improve the characteristic of transistors in the peripheral circuit and improve the uniformity of the diffusion resistance value.

10 Claims, 5 Drawing Sheets

METHOD OF MANUFACTURING SEMICONDUCTOR DEVICES

BACKGROUND OF THE INVENTION

1. Field of the Invention

The invention relates generally to a method of manufacturing semiconductor devices, and more particularly to a method of manufacturing a flash cell and a transistor in a peripheral circuit.

2. Description of the Prior Art

Semiconductor device are mainly divided into RAM products such as DRAM (dynamic random access memory) and SRAM (static random access memory) wherein data therein is lost as the time passes, which are volatile and fast in the input/output of the data, and ROM (read only memory) products which can maintain the data if the data is once inputted but is low in input/output of the data.

These ROM products may be classified into ROM, PROM (programmable ROM), EPROM (erasable PROM) and EEPROM (electrically EPROM). Among them, there is a trend that EEPROM capable of programming and erasing the data by an electrical method is increasingly demanded. The EEPROM or the flash EEPROM having a batch erasure function has a stack-type structure in which a floating gate electrode and a control gate electrode are stacked.

A memory cell of a stack-type gate structure can program/erase the data by means of a F-N tunneling (Fowler-Nordheim tunneling) effect and has a structure in which a tunnel oxide film, a floating gate electrode, a dielectric film and a control gate electrode are stacked on a semiconductor substrate. A plurality of metal bit lines having a constant distance in a column direction, are positioned in a memory cell array consisting of a plurality of the memory cells. Pluralities of word lines are positioned in a direction orthogonal to the plurality of the metal bit lines. Also, a single common source line is positioned every two word lines in the memory cell array. The common source line is positioned in the same direction to the word lines and consists of a plurality of common source junctions and a source connection layer. The metal bit lines are connected to the drain junctions via a metal contact formed between the two gate electrodes.

The method of manufacturing the flash cell array will be explained in detail as follows.

A device isolation film is formed on a semiconductor substrate, through isolation process such as local oxidation of silicon (LOCOS) process, thus defining an active region. A tunnel oxide film and a first polysilicon silicon layer for a floating gate electrode are sequentially formed on the active region of the semiconductor substrate. Then, the first polysilicon silicon layer on the field oxide film is etched by a photolithography process to separate the floating gate electrodes of each of the cells in a bit line direction. Thereafter, an ONO (oxide/nitride/oxide) film as a dielectric film, a second polysilicon layer and an insulating film for a control gate electrode (for use in a hard mask layer or an anti-reflection film) are sequentially stacked on the entire structure. Then, after forming a photoresist pattern for forming the word lines on the insulating film, the insulating film, the second polysilicon layer, the dielectric film and the first polysilicon silicon layer are sequentially etched using the photoresist pattern as an etch mask to form a stack type gate structure. At this time, the gate electrodes are formed in the peripheral circuit region.

Thereafter, the photoresist pattern is formed to open a region in which the common source region will be formed by means of photolithography process in order to perform a self align source (SAS) etching process. Next, the device isolation film in the opened regions is etched using the photoresist pattern as an etch mask. In order to form a spacer while compensating for a portion damaged by the self align source etch process, a self align source annealing process is performed. Then, a source/drain ion implantation process is performed to form a source and drain junction in the cell region and a low concentration junction in the peripheral circuit region. The oxide film for a spacer is deposited on the entire structure and the spacer is then formed by means of a blanket etch process being a subsequent process. Thereafter, a high concentration junction is formed in the peripheral circuit region for driving the cells by a high concentration ion implantation process, thus completing a transistor.

Next, a high temperature oxide (HTO) film, a PSG film and a borophosphosilicate glass (BPSG) film are sequentially deposited on the entire structure and the BPSG film is then flattened by a re-flow process in order to protect and flatten the cells and the transistor. Then, the layers stacked on the drain region of the cells via the photolithography process are removed by means of wet etch and dry etch to form a metal contact. Thereafter, a metal layer is deposited on the resulting surface and is then pattern by means of the photolithography process, thus forming bit lines electrically connected to the drain regions of the cells via the bit line contact.

The method of manufacturing the flash cell array has the following problems.

First, loss in the source junction of the semiconductor substrate, which is generated by the self align source etch process, is not uniform every portions. Thus, there is a difference in the overlapping range between the floating gate electrode and the source junction every loss portions. As a result, there occurs a problem that the characteristics of the cells constituting the array are not same.

Second, there is a problem that a locally bird's beak phenomenon the thickness of the oxide films constituting the ONO structure at the edge region of the dielectric film in the ONO structure is increased by means of the self align source annealing process, which is performed in order to compensate for damaged portions after the self align source etch process, is generated. As the thickness of the oxide films forming the ONO structure every cells is different by means of the above problem, a coupling ratio between the junctions of each of the cells and the floating gate electrode is different. Due to this, there occurs a difference in an electric field every cells. Thus, there is a difference in the erase operating speed in the cells within the sector using a F-N tunneling method, which degrades the erase distribution of the cells.

Third, there are problem that the tungsten silicide (WSi) film constituting the control gate electrode is opened upon the self align source etch process and the spacer is thickly formed at the opened tungsten silicide (WSi) film by the self align source annealing process being a subsequent process. This results from that the oxidation rate of the tungsten silicide (WSi) is very slow, which causes fluorine to leak from the tungsten silicide (WSi) film upon deposition a CVD spacer oxide film being a subsequent process so that the coupling between silicon (Si) and fluorine (F) rather than the coupling between silicon (Si) and oxygen (O) is prioritized. Due to this, the deposition speed of the spacer is locally increased to generate defects in the spacer and the width of the spacer is locally changed by the defects to cause a non-uniformity of a transistor characteristic.

Fourth, there occurs a non-uniformity of the source and drain junction depth, that is formed in a transistor of the peripheral circuit region. This problem is generated because the high concentration ion implantation process performed after the spacer etch process employs an oxide film remaining on the surface as a screen oxide film, employs a source material having a high atomic amount such as arsenic in order to prohibit the side diffusion and uses a low energy as an ion implantation energy. That is, the problem of the non-uniformity in the source and drain junction depth heavily depends on the uniformity of the oxide film remaining on the surface upon ion implantation process. In a prior art, as the deposited oxide film is experienced by a blanket etch process to etch the oxide film, it is difficult to obtain an oxide film having an uniform thickness and variations in the sheet resistance value of the junction used as the transistor characteristic and the passive device becomes also large.

Fifth, there is a problem of a short that occurs between the gate electrode and the junction. If the gate electrode and the junction being independent terminals contact, an unnecessary leakage current flows. This problem easily causes a short between the gate electrode and the junction by means of mis-alignment and pre-metal cleaning as the size of the transistor becomes smaller so the distance between the gate electrode and the junction becomes reduced.

Therefore, there is a need for a new method of manufacturing a flash cell for solving the above problems.

SUMMARY OF THE INVENTION

It is therefore an object of the present invention to increase the integrity capability of data by sequentially forming a dichlorosilane (DCS; $SiH_2Cl_2$) HTO film and a nitride film on the entire surface after a self align source etch process to prevent a local bird's beak phenomenon of a dielectric film between the floating gate electrode and a control gate electrode and using a spacer for compensating for the sidewall of a gate structure damaged upon the self align source etch process to prevent a movement of charges and holes between a floating gate electrode and a peripheral portion.

Also, another object of the present invention is to protect the gate electrodes from a stress applied by a subsequent process and also prevent generation of an oxide film generated by the subsequent process, by sequentially forming the DCS HTO and the nitride film on the entire structure.

In addition, a still another object of the present invention is to make uniform the depth of a junction upon a high concentration ion implantation and to improve the characteristic of transistors in a peripheral circuit and the uniformity of a diffusion resistance value, by allowing the nitride film to serve as a stopper by a select ratio upon the DCS HTO film etching process for forming a screen oxide film so that the etching rate can be controlled by sequentially forming the DCS HTO film and the nitride film on the entire structure.

In order to accomplish the above object, a method of manufacturing a semiconductor device according to the present invention is characterized in that it comprises the steps of providing a semiconductor substrate in which a cell region and a peripheral circuit region are defined; forming a patterned tunnel oxide film, a floating gate electrode and a control gate electrode in said cell region forming a gate electrode in said peripheral circuit region; removing an exposed portion of a device isolation film in said cell region by means of a self align source etch process; forming a first capping layer and a second capping layer on the entire structure; performing a self align source annealing process for said cell region; forming a source and drain junction in said cell region and forming a low concentration source and drain junction in said peripheral circuit region; forming a gate spacer in said peripheral circuit region; and forming a high concentration source and drain junction in said peripheral circuit region.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
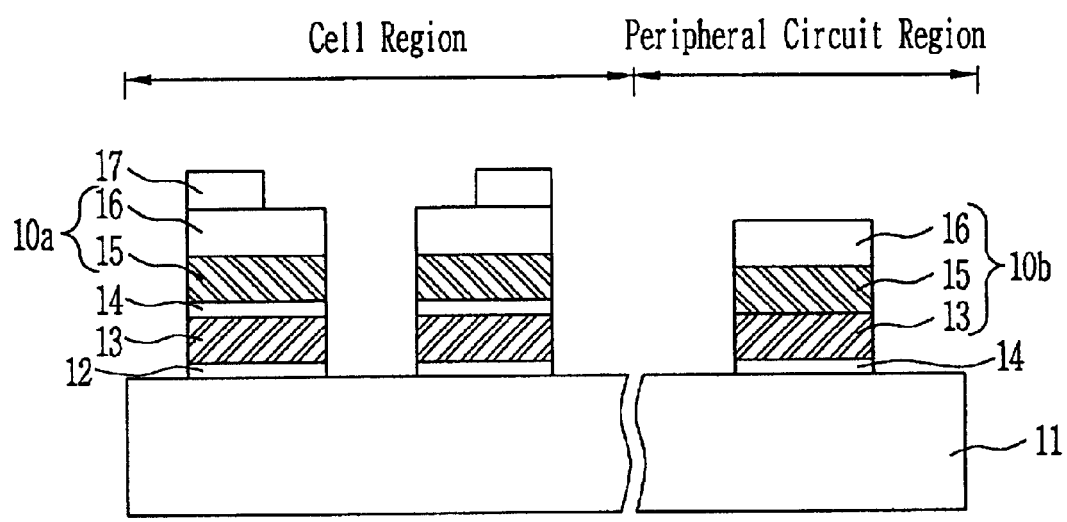
FIGS. 1A through 1G are cross-sectional views of semiconductor devices according to one embodiment of the present invention.

The present invention will be described in detail by way of a preferred embodiment with reference to accompanying drawings, in which like reference numerals are used to identify the same or similar parts.

FIGS. 1A through 1G are cross-sectional views of semiconductor devices according to one embodiment of the present invention.

Referring now to FIG. 1A, a device isolation film (not shown) is formed on a semiconductor substrate 11 by means of an isolation process such as local oxidation of silicon (LOCOS), thus defining an active region. After sequentially forming a tunnel oxide film 12 and a first polysilicon silicon layer 13 for a floating gate electrode on the active region of the semiconductor substrate 11, the first polysilicon silicon layer 13 on the device isolation film is etched by etching process, thus defining one side of the floating gate electrode. Then, a stack structure, in which an ONO (oxide/nitride/oxide) film as a dielectric film 14, a second polysilicon layer 15, a tungsten silicide 16 and an insulating film 17 are sequentially stacked, is completed.

Thereafter, a photoresist pattern for forming word lines (not shown) is formed on the insulating film 17. Then, the insulating film 17, the tungsten silicide film 16, the second polysilicon layer 15, the dielectric film 14 and the first polysilicon silicon layer 13 are sequentially etched using the photoresist pattern as an etch mask to complete a stack gate structure in which a control gate electrode 10a in which the second polysilicon layer 15 and the tungsten silicide film 16 are stacked and the floating gate electrode 13 made of the first polysilicon silicon layer 13 are stacked. At this time, a gate electrode 10b is formed in a peripheral circuit region. Next, in order to perform a self align source (SAS) etch process, a photoresist pattern is formed through which a common source region will be formed by photolithography process. Then, the device isolation film in the open region is etched using the photoresist pattern as an etch mask.

Figure 1B:
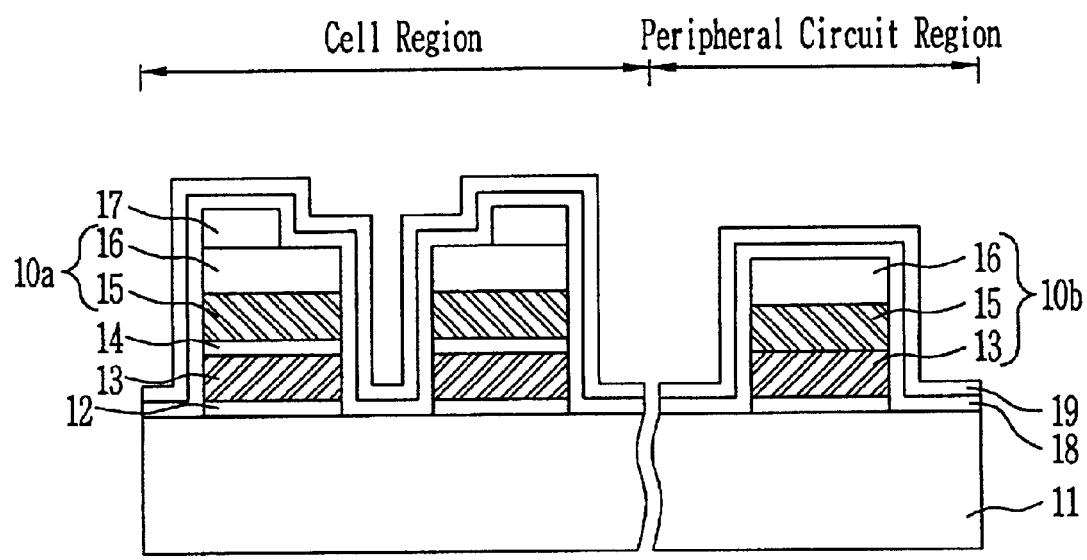

Referring now to FIG. 1B, a capping oxide film 18 and a capping nitride film 19 are sequentially formed on the entire structure. The thickness of the capping oxide film 18 is 100~200 Å by depositing DCS HTO and the thickness of the capping nitride film 19 is 50~200 Å.

Figure 1C:
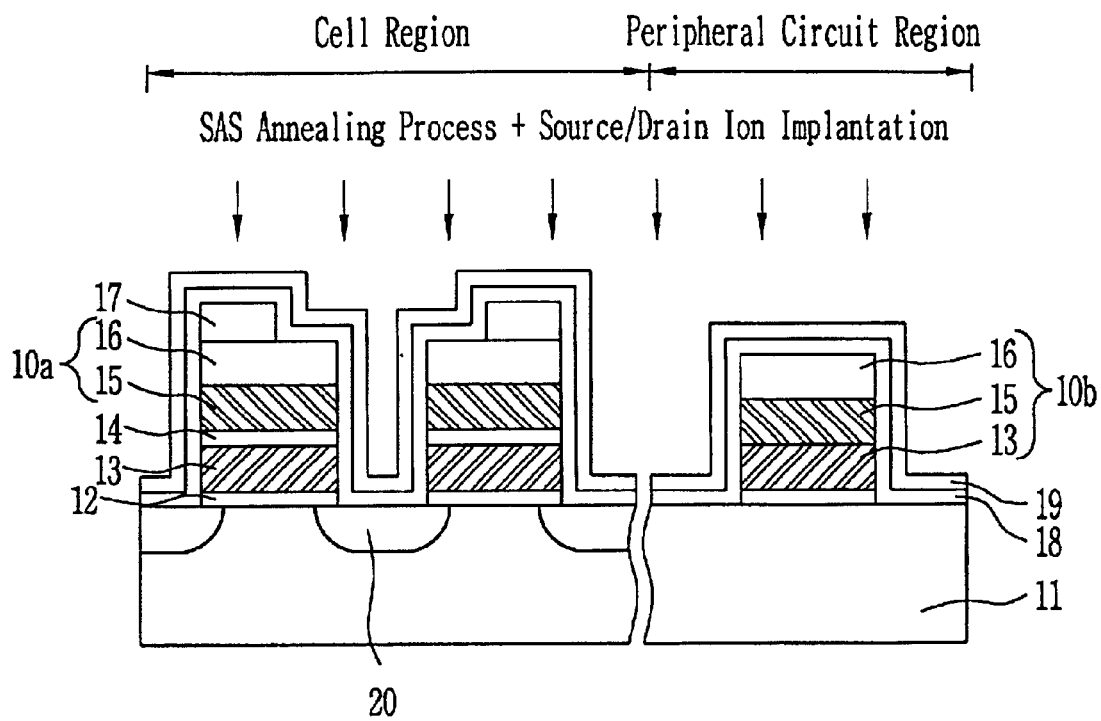

Referring now to FIG. 1C, a self align source thermal process for compensating for portions damaged by the self align source etch process is performed for the cell region and a source/drain ion implantation process using the source/drain ion implantation mask is then performed for the cell region, thus forming a source and drain junction 20. The source/drain ion implantation process is performed with the energy stronger about 10 KeV than a common ion implantation energy considering a projected range (Rp) since the capping oxide film 18 and the capping nitride film 19 are additionally formed. For example, in case of implanting arsenic (As75) ions, an ion implantation energy of 40~50 KeV is used.

Figure 1D:
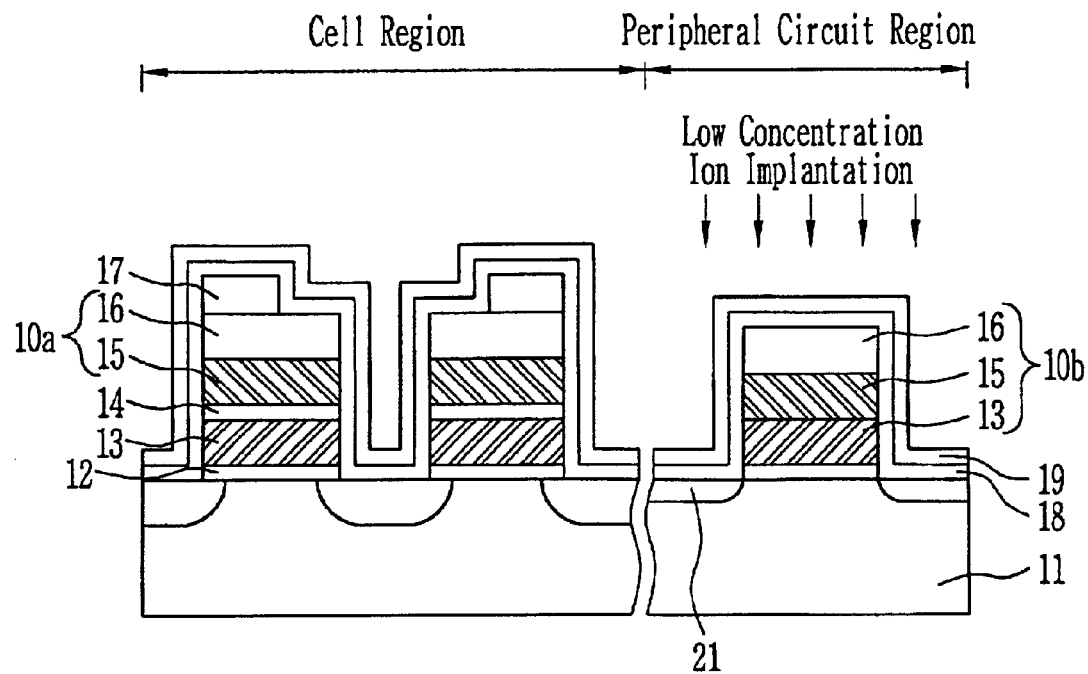

By reference to FIG. 1D, in order to form a transistor region in the peripheral circuit region, a low concentration source and drain junction 21 is formed by means of a low concentration ion implantation process using a low concentration ion implantation mask. The low concentration ion implantation process is performed with the energy stronger about 5 KeV than a common ion implantation energy considering a projected range (Rp) since the capping oxide film 18 and the capping nitride film 19 are additionally formed.

Figure 1E:
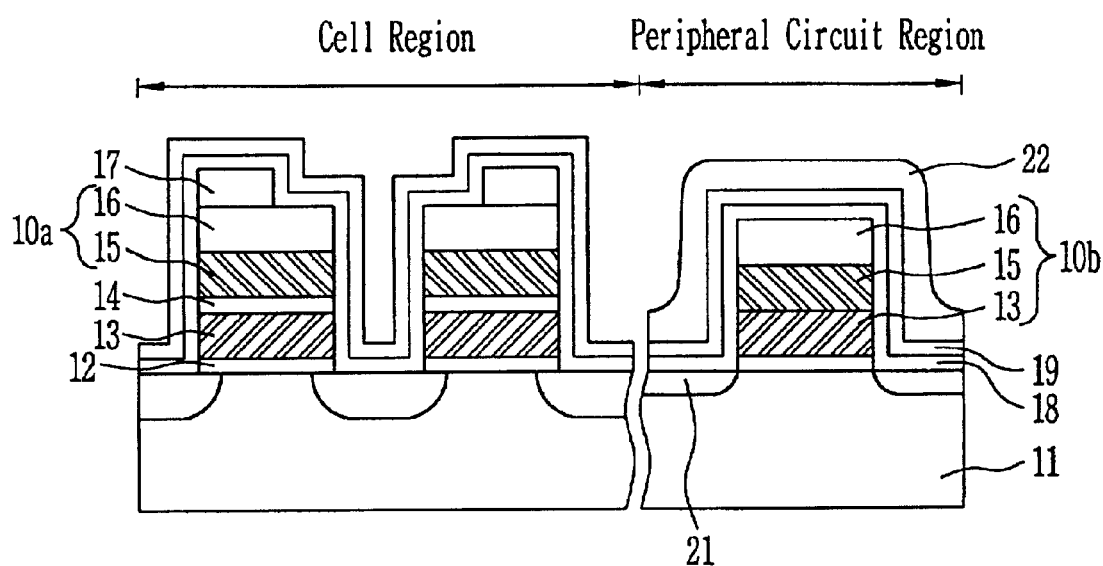

Referring now to FIG. 1E, an oxide film for spacer 22 is formed in the peripheral circuit region in order to control an overlap between the gate electrode 10b in the transistor and the low concentration source and drain junction 21. The oxide film for spacer 22 is formed in thickness of 1200~1600 Å, which is generally thinner by about 100~200 Å considering the deposition thickness of the capping oxide film 18 and the capping nitride film 19.

Figure 1F:
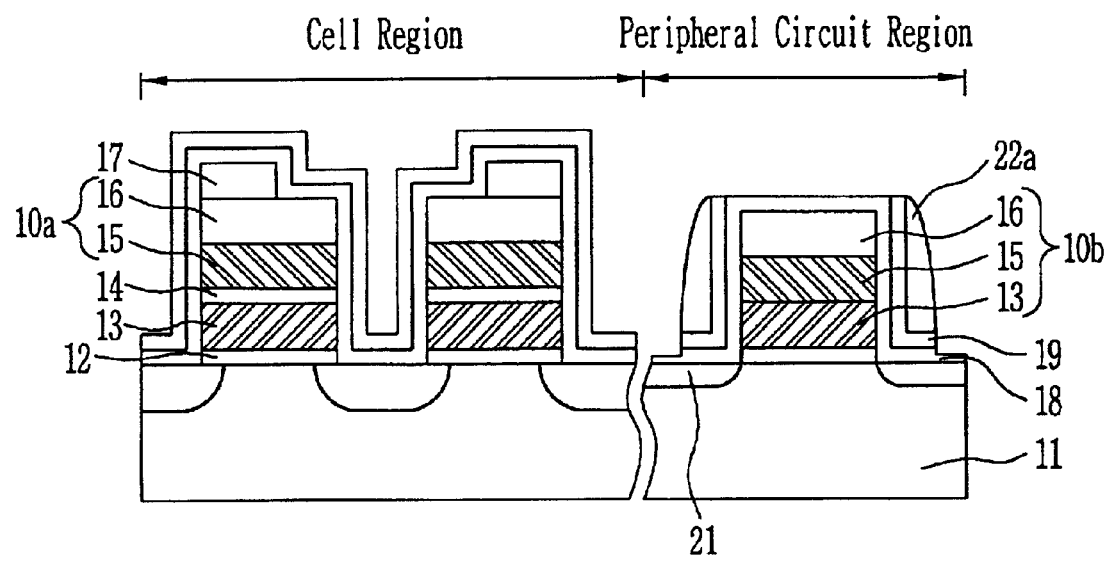

By reference to FIG. 1F, a spacer 22a is formed in the peripheral circuit region by means of a first blanket etch process. The first blanket etch process is performed considering the select ratio of the nitride film and the oxide film. The capping nitride film 19 serves as an etch stopper formed between the capping oxide film 18 and the oxide film for spacer 22. Thereafter, an exposed portion of the capping nitride film 19 is removed by means of a second blanket etch process. Due to this, a gate spacer of an ONO structure in which the capping oxide film 18, the capping nitride film 19 and the spacer 22a are stacked is formed at the sidewall of the gate electrode 10b, and the capping oxide film 18 of an uniform thickness is remained on the surface of the semiconductor substrate 11 in which the source and drain will be formed. The capping oxide film 18 remained on the surface of the semiconductor substrate 11 serves as a screen oxide film upon a high concentration ion implantation process being a subsequent process.

Figure 1G:
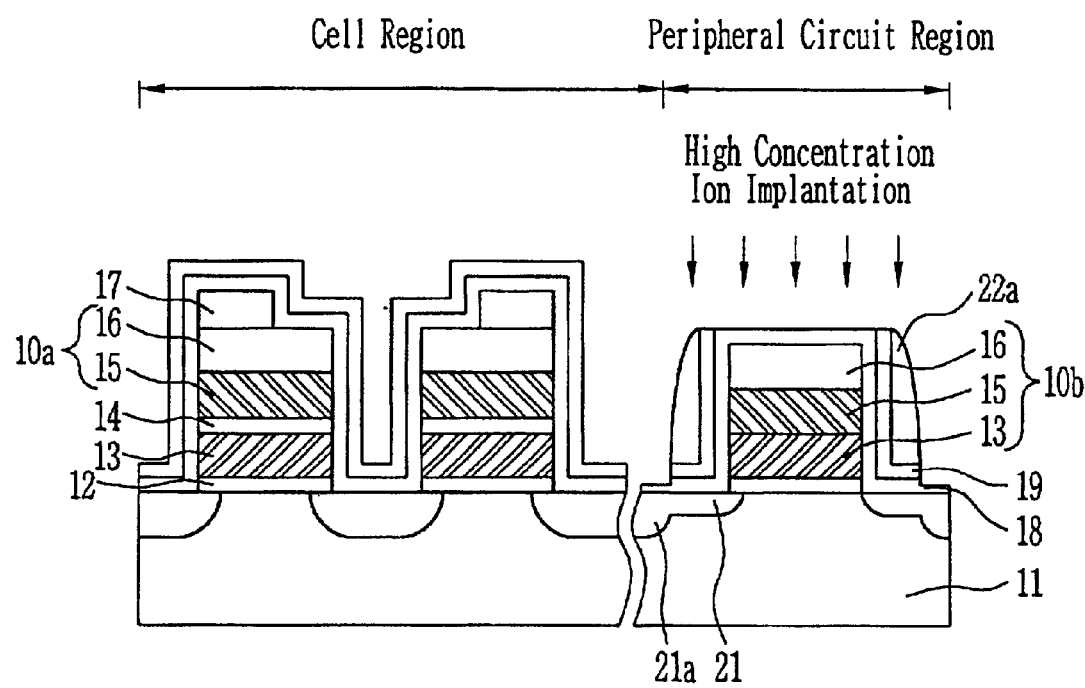

Referring now to FIG. 1G, a high concentration source and drain junction 21a of a LDD structure is formed in the peripheral circuit region by means of a high concentration ion implantation process using a high concentration ion implantation mask. The high concentration ion implantation process employs As or $BF_2$.

Subsequent processes will be shortly described since they are same to the conventional ones.

An IPO film, a PSG film and a BPSG (borophosphosilicate glass) film are sequentially stacked on the entire structure. Then, the BPSG film is flattened by means of a re-flow process for protecting and flattening the cells and the transistors. Thereafter, the layers stacked on the drain region in the cell region are removed by means of photolithography process using the photoresist pattern to form a contact hole. Next, a cleaning process for compensating for portions damaged by the etch process is performed. Then, a metal layer such as tungsten is deposited on the entire structure and is then pattern by photolithography process to form bit lines electrically connected to the drain region of the cell through the contact hole.

In case that the present invention is performed as above, how the conventional problems are solved will be described as follows.

A problem of a irregular depth of the source junction in the cell region, being the first conventional problem, is caused by performing the source/drain ion implantation process with the semiconductor substrate irregular upon etch process of the device isolation film. In order to solve this problem, the present invention forms the DCS HTO film and the nitride film to cover the gate electrode, after the gate electrode of a stack structure is formed. Thus, the DCS HTO film and the nitride film serve as a screen upon the source/drain ion implantation process to mitigate the non-uniformity in a loss of the semiconductor substrate, so that the source and drain junction of a uniform depth can be secured.

A problem of a weaken erase threshold voltage (Vt) distribution, being the second conventional problem, is caused by a local bird's beak phenomenon by which the thickness of an edge portion of the oxide films of an ONO structure constituting the dielectric film is increased upon a self align source annealing process. In order to solve this problem, the present invention forms the DCS HTO film and the nitride film on the entire structure, before the self align source annealing process is performed. The nitride film serves to block oxidization and has a film quality characteristic having the tension upon a thermal oxidization process. It is also known that the nitride film has a lot of charges and holes trap centers.

Figure 2:
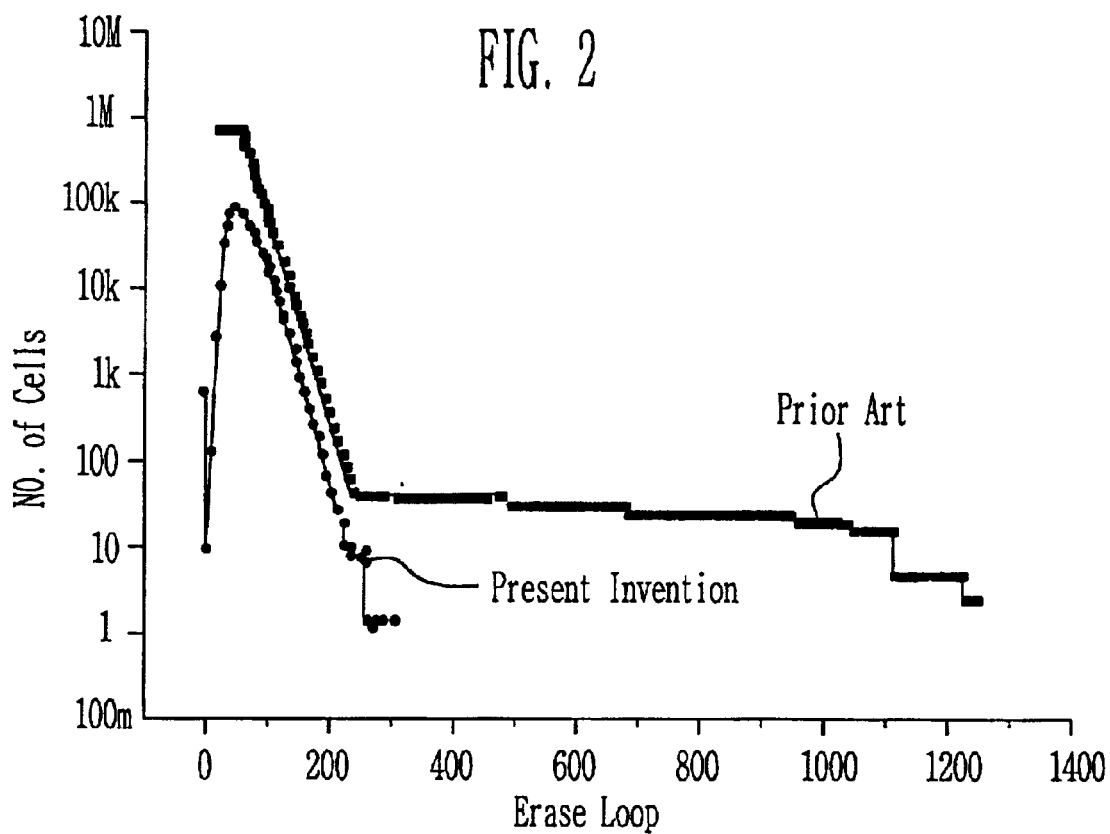
FIG. 2 is a device characteristic test graph.

In other words, the sidewalls of the gate electrodes of a stack structure are etched by means of plasma etch used in a self align source etch process, so that the first polysilicon silicon layer forming the floating gate electrode and the second polysilicon layer forming the control gate electrode (word lines) are severely damaged. In order to solve this problem, the present invention mitigates a stress due to tension of the nitride film and precludes the movement of charges and hole due to hopping or a Poole-Frenkel tunneling mechanism in the nitride film, by forming the gate electrode of a stack structure and then sequentially depositing the DCS HTO film and the nitride film on the gate electrode. Also, the present invention can not only prevent a local bird's beak phenomenon of an oxide film of an ONO structure but also improve the integrity characteristic of data, by forming an oxide film having a uniform thickness at the sidewalls of the gate electrodes to preclude a low-field F-N tunneling. Therefore, as shown in FIG. 2, the conventional method must perform an erase pulse loop count for passing the erase characteristic in a wide range, in order to prevent a failed erase due to a slow erase cell upon the erase pulse loop count because the local bird's beak phenomenon is generatedated the oxide film of an ONO structure. However, the present invention perform the erase characteristic test without any problems even the range of the erase pulse loop count is narrow, by preventing the local bird's beak phenomenon generated in the oxide film of an ONO structure.

Regarding the problem that the spacer is thickly formed at the portion of the tungsten silicide (WSi) film, being the third conventional problem, the present invention forms DCS HTO to cover the tungsten silicide (WSi) film before the self align source annealing process to secure the thickness of an oxide film enough to preclude diffusion of fluorine from the tungsten silicide (WSi) film, so that a coupling between silicon (Si) and fluorine (F) can be prevented.

Figure 3:
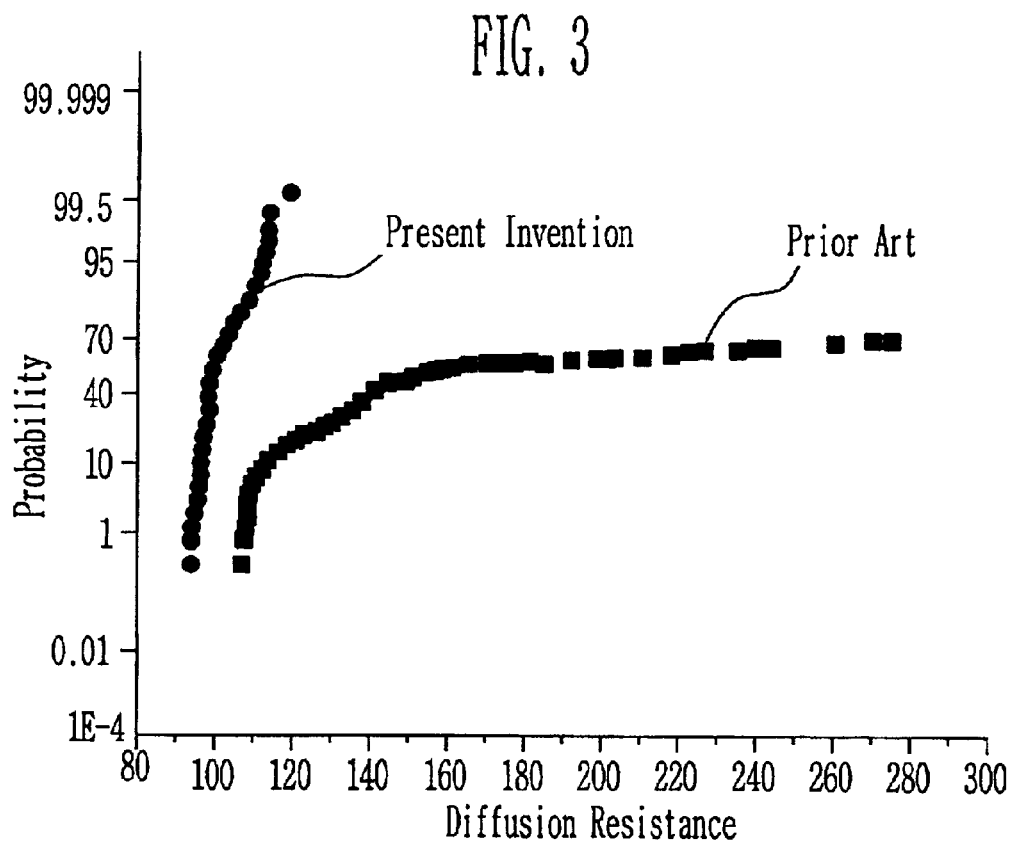
FIG. 3 is a diffusion resistance distribution graph.

Problems of the non-uniformity in the depth of the source and drain junction from the transistors in the peripheral circuit region and of variations in the diffusion resistance value of the passive device, being the fourth conventional problem, are caused by the non-uniformity of the screen oxide film. In order to solve this problem, the present invention forms the gate electrode and then forms the DCS HTO film and the nitride film on the entire structure, so that the nitride film can serve as an etch stopper upon a blanket etch process. Therefore, the etch thickness of the DCS HTO film can be controlled in thickness of 150~250 Å so that the oxide film of more than 90% can remain compared to adjustment of the oxide film of 1300~1600 Å, thus securing the uniformity of the screen oxide film. That is, as shown in FIG. 3, the uniformity in the transistor characteristic and the diffusion resistance value can be secured by uniformly securing the thickness of the oxide film screen upon a high concentration ion implantation process in the peripheral circuit region to make uniform the depth of the high concentration source and drain junction.

A short problem between the gate electrode and the junction, being the fifth conventional problem, is caused by a little mis-alignment and pre-metal cleaning in the process because the distance between the gate electrode and the junction is reduced as the size of the transistor is reduced. A subject of the etch process for forming a contact hole and the pre-metal cleaning process for removing a native oxide are all oxide film series. Therefore, in the present invention, the nitride film is formed enough to cover the gate electrode, so that the nitride film can serve as the etch stopper. Thus, the present invention can solve the short problem between the gate electrode and the junction by securing the thickness of the DCS HTO film and the nitride film.

Therefore, the present invention as above can further increase the integrity capability of data by solving the conventional problem.

As can be understood from the above description, the present invention forms a gate electrode of a stack structure and then forms a DCS HTO film and a nitride film to cover the gate electrode. Thus, the present invention can mitigate loss of the semiconductor substrate to secure the depth of a uniform source and drain junction upon the source/drain ion implantation process since the DCS HTO film and the nitride film serve as a screen.

Also, the present invention can mitigate a stress due to the tension of the nitride film and preclude the movement of charges and holes by hopping or Poole-Frenkel tunneling mechanism in the nitride film, by forming the DCS HTO film and the nitride film on the entire structure before the self align source annealing process. In addition, the present invention not only prevent a local bird's beak phenomenon of the oxide film of an ONO structure but also the integrity capability of data, by forming an oxide film of a uniform thickness at the sidewalls of the gate electrodes to preclude a low-field Fowler-Nordheim tunneling.

Further, the present invention can prevent a coupling between silicon (Si) and fluorine (F), by forming the DCS HTO film to cover the tungsten silicide film before the self align source annealing process to secure the thickness of the oxide film enough to preclude diffusion of fluorine from the tungsten silicide film.

In addition, the present invention forms the gate electrode and then forms the DCS HTO film and the nitride film formed on the entire structure so that the nitride film can serve as an etch stopper upon a blanket etch process.

Therefore, the present invention can secure the uniformity of the screen oxide film by controlling the etch thickness of the DCS HTO film in thickness of 150~250 Å to remain the oxide film of more than 90% compared to adjustment of the oxide film of 1300~1600 Å.

Also, the present invention can secure the uniformity of the transistor characteristic and the diffusion resistance value by forming a uniform screen oxide film to make uniform the depth of a high concentration source and drain junction.

Further, the present invention employs the nitride film as a etch stopper by forming the nitride film to cover the gate electrode. Thus, the present invention can solve a short problem between the gate electrode and the junction since it can always secure the thickness of the DCS HTO film and the nitride film.

In a prior art, upon the self align source annealing process, the sidewall spacer of the gate structure is formed while eroding the floating gate electrode and the control gate electrode. In the present invention, however, in case that the overlapping of the source and drain junction for the gate electrode is same, a method of depositing the DCS HTO film and the nitride film forms the sidewall spacer by eroding the floating gate electrode and the control gate electrode. Thus, the present invention can increase the efficiency of the device operation and minimize the damage of a tunnel oxide film since the tunneling region is increased due to overlapping between actual junction floating gate electrodes, thus increasing the reliability of devices.

Also, the present invention can skip a PSG film process being a subsequent process by allowing the two capping layers to serve as a capture of carriers.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. A method of manufacturing a semiconductor device, comprising the steps of:

forming a tunnel oxide film, a floating gate electrode, a dielectric film, a control gate electrode patterned in a cell region of a semiconductor substrate, and a gate electrode patterned in a peripheral circuit region of the semiconductor substrate;

forming a first capping layer and a second capping layer on the semiconductor substrate;

performing a self-align source annealing process for the cell region;

forming a source and drain junction in the cell region;

forming a low concentration source and drain junction in the peripheral circuit region;

forming a gate spacer in the peripheral circuit region; and forming a high concentration source and drain junction in the peripheral circuit region.

2. The method according to claim 1, wherein a thickness of the first capping layer is 100–200 Å.

3. The method according to claim 1, wherein a thickness of the second capping layer is 50–150 Å.

4. The method according to claim 1, wherein the gate spacer is formed of the first capping layer, the second capping layer, and an oxide film by a blanket etch process.

5. The method according to claim 4, wherein a thickness of the oxide film is 1200–1600 Å.

6. The method according to claim 4, wherein the oxide film is etched using the second capping layer as an etch stopper and the second capping layer is etched through to the first capping layer to form a screen oxide film.

7. The method according to claim 1, wherein the source and drain junction in the cell region is formed by using the first capping layer and the second capping layer as an ion implantation screen oxide film.

8. The method according to claim 1, wherein the low concentration source and drain junction in the peripheral circuit region is formed by using the first capping layer and the second capping layer as an ion implantation screen oxide film.

9. The method according to claim 1, wherein the high concentration source and drain junction in the peripheral circuit region is formed by using a lateral portion of the first capping layer etched as an ion implantation screen oxide film.

10. The method according to claim 1, wherein the first capping and the second capping layer prohibit formation of a local bird's beak of the dielectric film formed between the floating gate electrode and the control gate electrode.

* * * * *